(12) United States Patent
Lv et al.

(10) Patent No.: US 11,417,779 B2
(45) Date of Patent: Aug. 16, 2022

(54) GALLIUM OXIDE SBD TERMINAL STRUCTURE AND PREPARATION METHOD

(71) Applicant: THE 13TH RESEARCH INSTITUTE OF CHINA ELECTRONICS TECHNOLOGY GROUP CORPORATION, Shijiazhuang (CN)

(72) Inventors: Yuanjie Lv, Shijiazhuang (CN); Yuangang Wang, Shijiazhuang (CN); Xingye Zhou, Shijiazhuang (CN); Xin Tan, Shijiazhuang (CN); Xubo Song, Shijiazhuang (CN); Xuefeng Zou, Shijiazhuang (CN); Shixiong Liang, Shijiazhuang (CN); Zhihong Feng, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 0 days.

(21) Appl. No.: 17/069,071

(22) Filed: Oct. 13, 2020

(65) Prior Publication Data

US 2021/0043778 A1 Feb. 11, 2021

Related U.S. Application Data

(63) Continuation of application No. PCT/CN2020/089764, filed on May 12, 2020.

(30) Foreign Application Priority Data

Jun. 20, 2019 (CN) .......................... 201910537853.1

(51) Int. Cl.
*H01L 29/872* (2006.01)
*H01L 21/02* (2006.01)
(Continued)

(52) U.S. Cl.
CPC ...... *H01L 29/872* (2013.01); *H01L 21/02274* (2013.01); *H01L 21/02414* (2013.01);
(Continued)

(58) Field of Classification Search
CPC ......................... H01L 29/872; H01L 29/66969
See application file for complete search history.

(56) References Cited

U.S. PATENT DOCUMENTS 5,449,925 A * 9/1995 Baliga ................. H01L 29/6606
257/77
5,654,208 A * 8/1997 Harris ................. H01L 21/0465
438/522

(Continued)

FOREIGN PATENT DOCUMENTS

| CN | 103918082 A | 7/2014 |
| CN | 109767990 A | 5/2019 |

(Continued)

*Primary Examiner* — Vincent Wall
(74) *Attorney, Agent, or Firm* — Slater Matsil, LLP

(57) ABSTRACT

The disclosure is applicable for the technical field of semiconductor devices manufacturing, and provides a gallium oxide SBD terminal structure. The gallium oxide SBD terminal structure comprises a cathode metal layer, an $N^+$ high-concentration substrate layer, an $N^-$ low-concentration $Ga_2O_3$ epitaxial layer and an anode metal layer from bottom to top, wherein the $N^-$ low-concentration $Ga_2O_3$ epitaxial layer is within a range of certain thickness close to the anode metal layer; and a doping concentration below the anode metal layer is greater than a doping concentration on two sides of the anode metal layer. Namely, only a doping concentration of the part outside the corresponding area of the anode metal layer is changed, so that the breakdown voltage of the gallium oxide SBD terminal structure is improved under the condition of guaranteeing low on resistance.

12 Claims, 2 Drawing Sheets

(51) Int. Cl.
*H01L 29/06* (2006.01)
*H01L 29/66* (2006.01)

(52) U.S. Cl.
CPC .. *H01L 21/02565* (2013.01); *H01L 21/02631* (2013.01); *H01L 29/0619* (2013.01); *H01L 29/66969* (2013.01)

(56) References Cited

U.S. PATENT DOCUMENTS

| | | | | |
|---|---|---|---|---|
| 6,596,384 | B1* | 7/2003 | Day | H05K 3/382 |
| | | | | 428/209 |
| 7,074,643 | B2* | 7/2006 | Ryu | H01L 29/7828 |
| | | | | 438/105 |
| 8,069,558 | B2* | 12/2011 | Hirayama | H05K 1/187 |
| | | | | 29/841 |
| 10,199,512 | B2* | 2/2019 | Sasaki | H01L 21/02576 |
| 2004/0209109 | A1* | 10/2004 | Tsuchida | H05K 3/389 |
| | | | | 428/626 |
| 2005/0269573 | A1* | 12/2005 | Seng | H01L 21/0495 |
| | | | | 257/77 |
| 2011/0062450 | A1* | 3/2011 | Gammon | H01L 21/02576 |
| | | | | 257/E21.054 |
| 2011/0186862 | A1* | 8/2011 | Harada | H01L 29/6606 |
| | | | | 257/77 |
| 2014/0217469 | A1* | 8/2014 | Sasaki | H01L 21/02565 |
| | | | | 257/192 |
| 2014/0332823 | A1* | 11/2014 | Takizawa | H01L 21/02576 |
| | | | | 257/76 |
| 2016/0042949 | A1* | 2/2016 | Sasaki | H01L 29/24 |
| | | | | 257/617 |
| 2017/0179249 | A1* | 6/2017 | Oda | H01L 29/04 |
| 2017/0200790 | A1* | 7/2017 | Hitora | H01L 29/812 |
| 2019/0228971 | A1* | 7/2019 | Iguchi | H01L 21/268 |
| 2019/0295937 | A1* | 9/2019 | Zhang | H01L 23/16 |
| 2021/0043778 | A1* | 2/2021 | Lv | H01L 29/0619 |
| 2021/0280424 | A1* | 9/2021 | Rascuna | H01L 21/0485 |

FOREIGN PATENT DOCUMENTS

| | | |
|---|---|---|
| CN | 110265486 A | 9/2019 |
| WO | 2018199241 A1 | 11/2018 |

* cited by examiner

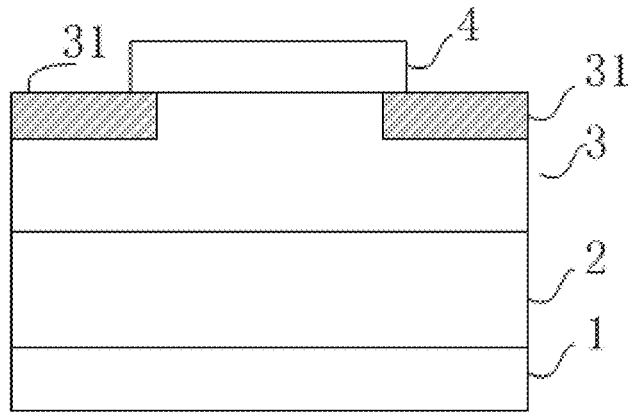

FIG. 1

```
┌─────────────────────────────────────────────────────────────┐          Step S 101
│ grow an N⁻ low-concentration Ga₂O₃ epitaxial layer on an N⁺ │
│                  high-concentration substrate layer          │
└─────────────────────────────────────────────────────────────┘
                              │
┌─────────────────────────────────────────────────────────────┐          Step S 102
│ deposit a mask layer on the N⁻ low-concentration Ga₂O₃ epitaxial layer │
└─────────────────────────────────────────────────────────────┘
                              │
┌─────────────────────────────────────────────────────────────┐          Step S 103
│ remove the part, outside the corresponding area of the anode metal layer, of the │
│        mask layer to obtain a gallium oxide SBD terminal sample          │
└─────────────────────────────────────────────────────────────┘
                              │
┌─────────────────────────────────────────────────────────────┐          Step S 104
│ carry out a high-temperature annealing treatment containing at least two │
│         temperatures on the gallium oxide SBD terminal sample            │
└─────────────────────────────────────────────────────────────┘
                              │
┌─────────────────────────────────────────────────────────────┐          Step S 105
│ remove the mask layer on the gallium oxide SBD terminal sample subjected to the │
│ high-temperature annealing treatment, and respectively form an anode metal layer │
│  and a cathode metal layer on two sides of the gallium oxide SBD terminal sample │
└─────────────────────────────────────────────────────────────┘
```

FIG. 2

GALLIUM OXIDE SBD TERMINAL STRUCTURE AND PREPARATION METHOD

CROSS-REFERENCE TO RELATED APPLICATIONS

This application is a continuation application of International Application No. PCT/CN2020/089764, filed on May 12, 2020, which claims priority to Chinese Patent Application No. CN201910537853.1, filed on Jun. 20, 2019. The disclosures of the aforementioned applications are hereby incorporated herein by reference in their entireties.

TECHNICAL FIELD

The disclosure belongs to the technical field of semiconductor device manufacturing, and particularly relates to a gallium oxide SBD terminal structure and a preparation method thereof.

BACKGROUND

Power electronic devices, also known as power semiconductor devices, are mainly used for power variation and circuit control of power equipment. They are the core devices for power control and conversion of industrial facilities, household appliances and other equipment, and can carry out typical power processing, including frequency conversion, voltage transformation, current transformation, power management and the like. Silicon-based semiconductor power devices are the most commonly used power devices in power systems at present, but their performance is close to the theoretical limit determined by their materials, which makes the power density increase in saturation trend.

As a new semiconductor material, ultra-wide band gap gallium oxide has prominent advantages in terms of breakdown field strength, Baliga's figure of merit and cost. At present, five crystalline forms of gallium oxide, α, ρ, γ, δ and ε have been discovered. Among them, the β-structure gallium oxide is the most stable. So far, the research on gallium oxide in the semiconductor field has been on the β-structure gallium oxide. Baliga's figure of merit is generally used to characterize the extent to which the material is suitable for power devices internationally. The Baliga's figure of merit of β-$Ga_2O_3$ material is 3444 times greater than the Baliga's figure of merit of the first generation semiconductor Si material, and 4 times greater than the Baliga's figure of merit of the third generation wide band gap semiconductor GaN material, and 10 times greater than the Baliga's figure of merit of SiC material. β-$Ga_2O_3$ power devices have a lower on resistance and lower power consumption on the condition of the same withstand voltage as GaN and SiC devices, which can greatly reduce the power loss during device operation.

Image force induced barrier lowering effect is a bottleneck problem that limits the characteristics of gallium oxide SBD (Schottky Barrier Diode). Lowering the drift region concentration by a plasma treatment process can alleviate the image force induced barrier lowering effect and improve the breakdown voltage of the device. By introducing Ar ion implantation, the area outside the anode junction becomes a high resistance region, and the anode electric field is adjusted to improve the breakdown voltage. However, Ar ion implantation has great damage to the material, and influences further improvement of the breakdown voltage. How to further improve the breakdown voltage under the condition of ensuring a low on resistance becomes an urgent problem.

SUMMARY OF THE INVENTION

These and other problems are generally solved or circumvented, and technical advantages are generally achieved, by embodiments of the present disclosure which provide a gallium oxide SBD terminal structure and a preparation method.

Technical Problem

Therefore, the embodiment of the disclosure provides a gallium oxide SBD terminal structure and a preparation method thereof, so as to solve the problem of further improving the breakdown voltage under the condition of ensuring a low on resistance in the prior art.

Technical Solution

The first aspect of the embodiment of the disclosure provides a gallium oxide SBD terminal structure, so as to solve the problem of further improving the breakdown voltage under the condition of ensuring a low on resistance in the prior art.

The gallium oxide SBD terminal structure comprises a cathode metal layer, an $N^+$ high-concentration substrate layer, an $N^-$ low-concentration $Ga_2O_3$ epitaxial layer and an anode metal layer from bottom to top, wherein the $N^-$ low-concentration $Ga_2O_3$ epitaxial layer is within a range of a certain thickness close to the anode metal layer; and a doping concentration below the anode metal layer is greater than a doping concentration on two sides of the anode metal layer.

In one embodiment, a doping concentration of the $N^-$ low-concentration $Ga_2O_3$ epitaxial layer gradually reduces from bottom to top within the range of the certain thickness close to the anode metal layer.

In one embodiment, an electron concentration of the $N^-$ low-concentration $Ga_2O_3$ epitaxial layer is from $1.0\times10^{15}$ $cm^{-3}$ to $1.0\times10^{20}$ $cm^{-3}$.

In one embodiment, a thickness of the $N^-$ low-concentration $Ga_2O_3$ epitaxial layer is from 100 nm to 50 μm.

In one embodiment, a material of the $N^+$ high-concentration substrate layer is $Ga_2O_3$ or SiC.

In one embodiment, the anode metal layer is an Ni/Au layer, and the cathode metal layer is a Ti/Au layer.

The second aspect of an embodiment of the present application provides a preparation method of a gallium oxide SBD terminal structure, and the preparation method comprising: growing an $N^-$ low-concentration $Ga_2O_3$ epitaxial layer on an $N^+$ high-concentration substrate layer; depositing a mask layer on the $N^-$ low-concentration $Ga_2O_3$ epitaxial layer; removing the part, outside the corresponding area of the anode metal layer, of the mask layer to obtain a gallium oxide SBD terminal sample; carrying out a high-temperature annealing treatment containing at least two temperatures on the gallium oxide SBD terminal sample; and removing the mask layer on the gallium oxide SBD terminal sample subjected to the high-temperature annealing treatment, and respectively forming an anode metal layer and a cathode metal layer on two sides of the gallium oxide SBD terminal sample.

In one embodiment, a material of the mask layer is $SiO_2$, SiN or $Al_2O_3$ which is formed by PECVD or sputtering.

In one embodiment, the high-temperature annealing treatment is performed in an oxygen atmosphere.

In one embodiment, a temperature variation manner of the high-temperature annealing treatment is a linear or stepped variation.

In one embodiment, an annealing temperature of the high-temperature annealing treatment is any value from 200° C. to 900° C., and an annealing time of the high-temperature annealing treatment is from 10 seconds to 100 minutes.

In one embodiment, the high-temperature annealing treatment has two annealing temperatures, and the two annealing temperatures are 400° C. and 450° C. respectively, and the annealing time at each temperature is 10 minutes.

Advantageous Effects of the Disclosure

According to the embodiment of the application, the mask layer is deposited on the $N^-$ low-concentration $Ga_2O_3$ epitaxial layer. And the part, outside the corresponding area of the anode metal layer, of the mask layer is removed to obtain a gallium oxide SBD terminal sample with only the area corresponding to the anode metal layer covered with the mask layer. And the gallium oxide SBD terminal sample is subjected to annealing treatment, which can only make the part, outside the corresponding area of the anode metal layer, of the mask layer forming the gradually reduced change of the doping concentration from bottom to top, without changing the doping concentration of the corresponding area of the anode metal layer. So that the breakdown voltage of the gallium oxide SBD terminal structure is improved under the condition of guaranteeing a low on resistance.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to explain the technical solutions in the embodiments of the present application more clearly, the following will briefly introduce the drawings that need to be used in the embodiments or in the description of the prior art. Obviously, the drawings in the following description are only some embodiments of the application, for those of ordinary skill in the art, other drawings can be obtained based on these drawings without creative labor.

FIG. 1 is a schematic view of a gallium oxide SBD terminal structure provided in an embodiment of the disclosure;

FIG. 2 is a flowchart of the preparation method of the gallium oxide SBD terminal structure provided in an embodiment of the disclosure;

Figure 3:
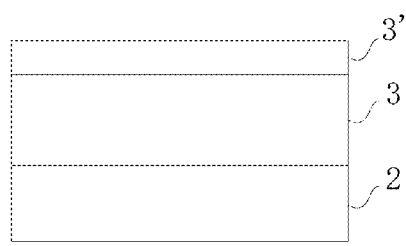
FIG. 3 is a schematic view of the gallium oxide SBD terminal structure depositing a mask layer provided in an embodiment of the disclosure.

In the figures: 1. a cathode metal layer; 2. an $N^+$ high-concentration substrate layer; 3. an $N^-$ low-concentration $Ga_2O_3$ epitaxial layer; 31. a second $N^-$ low-concentration $Ga_2O_3$ epitaxial layer; 3'. a mask layer; 4. an anode metal layer.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In the following description, for purposes of explanation and not limitation, specific details are set forth such as the particular system architecture, techniques, etc. in order to provide a thorough understanding of the embodiments of the present application. However, it will be apparent to those skilled in the art that the present application may be practiced in other embodiments without these specific details. In other instances, detailed descriptions of well-known systems, devices, circuits, and methods are omitted so as not to obscure the description of the present application with unnecessary detail.

In order to illustrate the technical solution in the present application, specific examples are set forth below.

As shown in FIG. 1, the gallium oxide Schottky barrier diode (SBD) terminal structure comprises a cathode metal layer 1, an $N^+$ high-concentration substrate layer 2, an N-low-concentration $Ga_2O_3$ epitaxial layer 3 and an anode metal layer 4, wherein the $N^-$ low-concentration $Ga_2O_3$ epitaxial layer 3 is within a range of a certain thickness close to the anode metal layer 4; and a doping concentration below the anode metal layer is greater than a doping concentration on two sides of the anode metal layer.

In particular, a second $N^-$ low-concentration $Ga_2O_3$ epitaxial layer 31 belongs to the $N^-$ low-concentration $Ga_2O_3$ epitaxial layer 3, and is the part outside the corresponding area of the anode metal layer in a certain thickness range close to the anode metal layer. A doping concentration of the second $N^-$ low-concentration $Ga_2O_3$ epitaxial layer 31 is lower than a doping concentration of the corresponding area of the anode metal layer.

On the basis of the above embodiments, other embodiments are as follows.

In one embodiment, an electron concentration of the $N^-$ low-concentration $Ga_2O_3$ epitaxial layer is from $1.0 \times 10^{15}$ $cm^{-3}$ to $1.0 \times 10^{20}$ $cm^{-3}$.

Specifically, the doping concentration of the $N^-$ low-concentration $Ga_2O_3$ epitaxial layer 3 may be a fixed value or a gradient value.

In one embodiment, the $N^-$ low-concentration $Ga_2O_3$ epitaxial layer 3 has a thickness of from 100 nm to 50 μm.

In one embodiment, the material of the $N^+$ high-concentration substrate layer 2 is $Ga_2O_3$ or SiC.

In one embodiment, the anode metal layer is an Ni/Au layer, and the cathode metal layer is a Ti/Au layer.

As shown in FIG. 2, the application discloses a preparation method of the gallium oxide SBD terminal structure, and the preparation method comprising the following steps.

At Step S101, grow an N⁻ low-concentration $Ga_2O_3$ epitaxial layer on the N⁺ high-concentration substrate layer.

At Step S102, as shown in FIG. 3, deposit a mask layer 3' on the N⁻ low-concentration $Ga_2O_3$ epitaxial layer.

In one embodiment, the material of the mask layer is $SiO_2$, SiN or $Al_2O_3$ which is formed by PECVD or sputtering.

Specifically, the thickness of the mask layer is from 50 nm to 3000 nm.

At Step S103, remove the part, outside the corresponding area of the anode metal layer, of the mask layer to obtain a gallium oxide SBD terminal sample.

Specifically, a photoresist layer can be coated on the corresponding area of the anode metal layer, and then the mask layer of the part outside the corresponding area of the anode metal layer is removed by adopting a dry etching method or a wet etching method.

Figure 4:
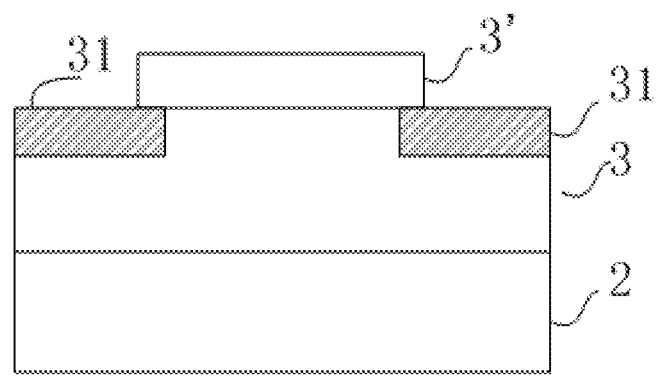
FIG. 4 is a schematic view showing the structure of the gallium oxide SBD terminal sample after annealing treatment provided in an embodiment of the disclosure.

At Step S104, as shown in FIG. 4, carry out a high-temperature annealing treatment containing at least two temperatures on the gallium oxide SBD terminal sample.

Specifically, since the mask layer 3' is deposited on the upper surface of the N⁻ low-concentration $Ga_2O_3$ epitaxial layer corresponding to the anode metal layer, the doping concentration of the part outside the corresponding area of the anode metal layer can be gradually reduced from bottom to top within a certain thickness range close to the anode metal layer through an annealing treatment. But the doping concentration of the corresponding area of the anode metal layer is not changed by the annealing treatment, namely, the area below the anode metal layer is not subjected to the annealing treatment, so that the transverse concentration change is introduced into the N⁻ low-concentration $Ga_2O_3$ epitaxial layer within a certain thickness range close to the anode metal layer, and the on resistance of the whole gallium oxide SBD terminal structure is lower.

The doping concentration of the surface area of the N⁻ low-concentration $Ga_2O_3$ epitaxial layer is reduced by the annealing treatment at two different temperatures, so that the doping concentration is gradually reduced from bottom to top and from inside to surface.

At Step S105, remove the mask layer on the gallium oxide SBD terminal sample subjected to the high-temperature annealing treatment, and respectively form an anode metal layer and a cathode metal layer on two sides of the gallium oxide SBD terminal sample.

In one embodiment, the high-temperature annealing treatment is performed in an oxygen atmosphere.

In one embodiment, the temperature variation manner of the high-temperature annealing treatment is a linear or stepped variation.

The temperature change can be firstly a high temperature and then a low temperature, or can be firstly a low temperature and then a high temperature.

In one embodiment, the annealing temperature of the high-temperature annealing treatment is any value from 200° C. to 900° C., and the annealing time of the high-temperature annealing treatment is from 10 seconds to 100 minutes.

In one embodiment, the high-temperature annealing treatment has two annealing temperatures, and the two annealing temperatures are 400° C. and 450° C. respectively, and the annealing time at each temperature is 10 minutes.

The above-described embodiments are merely illustrative of the technical solutions of the present application and are not intended to be limiting thereof; although the present application has been described in detail with reference to the foregoing embodiments, those skilled in the art will appreciate that: the technical solutions of the above-mentioned embodiments can still be modified, or some of the technical features thereof can be equivalently replaced; such modifications and substitutions do not depart the essence of the corresponding technical solutions from the spirit and scope of the embodiments of the present application, and are intended to be included within the scope of this application.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A preparation method of fabricating a gallium oxide SBD terminal structure, the preparation method comprising:
providing an N+high-concentration substrate layer;
growing an N−low-concentration $Ga_2O_3$ epitaxial layer on the N+high-concentration substrate layer;
depositing a mask layer on the N− low-concentration $Ga_2O_3$ epitaxial layer;
removing side portions of the mask layer, wherein:
removing the side portions of the mask layer leaves a central portion of the mask layer;
removing the side portions of the mask layer exposes the N−low-concentration $Ga_2O_3$ epitaxial layer; and
removing the side portions of the mask layer forms a remaining mask layer;
performing a high-temperature annealing treatment containing at least two temperatures after removing the side portions of the mask layer;
removing the remaining mask layer after performing the high-temperature annealing treatment;
forming a cathode metal layer on a bottom surface of the N+high-concentration substrate layer after removing the remaining mask layer; and
forming an anode metal layer on a top surface of the N−low-concentration $Ga_2O_3$ epitaxial layer after removing the remaining mask layer.

2. The preparation method of claim 1, wherein a material of the mask layer is $SiO_2$, SiN or $Al_2O_3$ which is formed by PECVD or sputtering.

3. The preparation method of claim 2, wherein one of the at least two temperatures of the high-temperature annealing treatment is any value from 200° C. to 900° C., and an annealing time of the high-temperature annealing treatment is from 10 seconds to 100 minutes.

4. The preparation method of claim 3, wherein the high-temperature annealing treatment has two annealing temperatures, and the two annealing temperatures are 400° C. and 450° C. respectively, and the annealing time at each temperature is 10 minutes.

5. The preparation method of claim 1, wherein the high-temperature annealing treatment is performed in an oxygen atmosphere.

6. The preparation method of claim 5, wherein one of the at least two temperatures of the high-temperature annealing treatment is any value from 200° C. to 900° C., and an annealing time of the high-temperature annealing treatment is from 10 seconds to 100 minutes.

7. The preparation method of claim 6, wherein the high-temperature annealing treatment has two annealing temperatures, and the two annealing temperatures are 400° C. and 450° C. respectively, and the annealing time at each temperature is 10 minutes.

8. The preparation method of claim 1, wherein a temperature variation manner of the high-temperature annealing treatment is a linear or stepped variation.

9. The preparation method of claim 8, wherein one of the at least two temperatures of the high-temperature annealing treatment is any value from 200° C. to 900° C., and an annealing time of the high-temperature annealing treatment is from 10 seconds to 100 minutes.

10. The preparation method of claim 9, wherein the high-temperature annealing treatment has two annealing temperatures, and the two annealing temperatures are 400° C. and 450° C. respectively, and the annealing time at each temperature is 10 minutes.

11. The preparation method of claim 1, wherein an annealing temperature of the high-temperature annealing treatment is any value from 200° C. to 900° C., and an annealing time of the high-temperature annealing treatment is from 10 seconds to 100 minutes.

12. The preparation method of claim 11, wherein the high-temperature annealing treatment has two annealing temperatures, and the two annealing temperatures are 400° C. and 450° C. respectively, and the annealing time at each temperature is 10 minutes.

* * * * *